(12) United States Patent
Kwan et al.

(10) Patent No.: US 9,976,931 B2
(45) Date of Patent: May 22, 2018

(54) OPTICAL IMAGING ARRANGEMENT WITH MULTIPLE METROLOGY SUPPORT UNITS

(71) Applicant: Carl Zeiss SMT GmbH, Oberkochen (DE)

(72) Inventors: Yim-Bun Patrick Kwan, Aalen (DE); Erik Ruinemans, Eindhoven (NL)

(73) Assignee: Carl Zeiss SMT GmbH, Oberkochen (DE)

( * ) Notice: Subject to any disclaimer, the term of this patent is extended or adjusted under 35 U.S.C. 154(b) by 158 days.

(21) Appl. No.: 14/536,887

(22) Filed: Nov. 10, 2014

(65) Prior Publication Data

US 2015/0062596 A1   Mar. 5, 2015

Related U.S. Application Data

(63) Continuation of application No. PCT/EP2012/060284, filed on May 31, 2012.

(51) Int. Cl.
  *G01B 11/14* (2006.01)
  *G01M 11/08* (2006.01)
  *G03F 7/20* (2006.01)

(52) U.S. Cl.
  CPC .......... *G01M 11/081* (2013.01); *G01B 11/14* (2013.01); *G03F 7/709* (2013.01);
  (Continued)

(58) Field of Classification Search
  CPC .. G01B 11/14; G01M 11/081; G03F 7/70825; G03F 7/70833; G03F 7/709
  See application file for complete search history.

(56) References Cited

U.S. PATENT DOCUMENTS

2003/0058422 A1   3/2003   Loopstra et al.
2003/0168615 A1   9/2003   Loopstra et al.
(Continued)

FOREIGN PATENT DOCUMENTS

CN   101614968 A   12/2009
EP   1 107 068 A2   6/2001
(Continued)

OTHER PUBLICATIONS

Japanese Office Action, with translation thereof, for JP Appl No. 2015-514362, dated Apr. 21, 2016.
(Continued)

*Primary Examiner* — Sunghee Y Gray
(74) *Attorney, Agent, or Firm* — Fish & Richardson P.C.

(57) ABSTRACT

An optical imaging arrangement includes an optical projection system and a support structure system. The optical projection system includes a group of optical elements configured to transfer, in an exposure process using exposure light along an exposure light path, an image of a pattern of a mask onto a substrate. The support structure system includes an optical element support structure and a metrology support structure. The optical element support structure supports the group of optical elements, while the metrology support structure supports a group of metrology devices associated with the group of optical elements and configured to capture status information representative of at least one of a position and an orientation of each of the optical elements in at least one degree of freedom up to all six degrees of freedom.

25 Claims, 5 Drawing Sheets

(52) U.S. Cl.
CPC ...... *G03F 7/70316* (2013.01); *G03F 7/70825* (2013.01); *G03F 7/70833* (2013.01)

(56) References Cited

U.S. PATENT DOCUMENTS

| | | |
|---|---|---|
| 2004/0227107 A1 | 11/2004 | Cox et al. |
| 2004/0227915 A1 | 11/2004 | Ohtsuka |
| 2005/0083500 A1 | 4/2005 | Franken |
| 2005/0140950 A1 | 6/2005 | Franken et al. |
| 2008/0212083 A1* | 9/2008 | Kwan ................. G03F 7/70258 356/124 |
| 2009/0260243 A1* | 10/2009 | Evans ................. B25J 17/0216 33/502 |
| 2009/0303626 A1 | 12/2009 | Xalter et al. |
| 2010/0304307 A1* | 12/2010 | Aoki ....................... G03F 7/709 430/319 |
| 2011/0001945 A1 | 1/2011 | Shiraishi |

FOREIGN PATENT DOCUMENTS

| | | |
|---|---|---|
| EP | 1 513 018 | 3/2005 |
| EP | 1 513 021 | 3/2005 |
| JP | 2001-351855 | 12/2001 |
| JP | 2003-163160 A | 6/2003 |
| JP | 2004-266264 A | 9/2004 |
| JP | 2004-343078 A | 12/2004 |
| JP | 2005-101593 A | 4/2005 |
| JP | 2011-014908 A | 1/2011 |
| TW | 2005-13790 | 4/2005 |
| WO | WO 2005/083487 | 9/2005 |
| WO | WO 2013/004403 | 1/2013 |

OTHER PUBLICATIONS

The International Search Report and Written Opinion for corresponding PCT Appl No. PCT/EP2012/060284, mailed Feb. 22, 2013.

Chinese Office Action, with translation thereof, for corresponding CN Appl No. 201280073487.5, dated Feb. 1, 2016.

The International Preliminary Report on Patentability for corresponding PCT Appl No. PCT/EP2012/060284, mailed Dec. 2, 2014.

Taiwanese Office Action and Search Report with English Translation thereof for Appln. No. 102119229, dated May 26, 2017, 8 pages.

* cited by examiner

OPTICAL IMAGING ARRANGEMENT WITH MULTIPLE METROLOGY SUPPORT UNITS

CROSS-REFERENCE TO RELATED APPLICATIONS

The present application is a continuation of, and claims benefit under 35 USC 120 to, international application PCT/EP2012/060284, filed May 31, 2012, the entire disclosure of which is incorporated by reference herein.

BACKGROUND OF THE INVENTION

The invention relates to optical imaging arrangements used in exposure processes, in particular to optical imaging arrangements of microlithography systems. It further relates to a method of supporting components of an optical projection unit. The invention may be used in the context of photolithography processes for fabricating microelectronic devices, in particular semiconductor devices, or in the context of fabricating devices, such as masks or reticles, used during such photolithography processes.

Typically, the optical systems used in the context of fabricating microelectronic devices such as semiconductor devices comprise a plurality of optical element units comprising optical elements, such as lenses and mirrors etc., arranged in the light path of the optical system. Those optical elements usually cooperate in an exposure process to transfer an image of a pattern formed on a mask, reticle or the like onto a substrate such as a wafer. The optical elements are usually combined in one or more functionally distinct optical element groups. These distinct optical element groups may be held by distinct optical exposure units. In particular with mainly refractive systems, such optical exposure units are often built from a stack of optical element modules holding one or more optical elements. These optical element modules usually comprise an external generally ring shaped support device supporting one or more optical element holders each, in turn, holding an optical element.

Optical element groups comprising at least mainly refractive optical elements, such as lenses, mostly have a straight common axis of symmetry of the optical elements usually referred to as the optical axis. Moreover, the optical exposure units holding such optical element groups often have an elongated substantially tubular design due to which they are typically also referred to as lens barrels.

Due to the ongoing miniaturization of semiconductor devices there is a permanent need for enhanced resolution of the optical systems used for fabricating those semiconductor devices. This need for enhanced resolution obviously pushes the need for an increased numerical aperture (NA) and increased imaging accuracy of the optical system.

One approach to achieve enhanced resolution is to reduce the wavelength of the light used in the exposure process. In the recent years, approaches have been made to use light in the extreme ultraviolet (EUV) range using wavelengths ranging from 5 nm to 20 nm, typically about 13 nm. In this EUV range it is not possible to use common refractive optics any more. This is due to the fact that, in this EUV range, the materials commonly used for refractive optical elements show a degree of absorption that is too high for obtaining high quality exposure results. Thus, in the EUV range, reflective systems comprising reflective elements such as mirrors or the like are used in the exposure process to transfer the image of the pattern formed on the mask onto the substrate, e.g. the wafer.

The transition to the use of high numerical aperture (e.g. NA>0.4 to 0.5) reflective systems in the EUV range leads to considerable challenges with respect to the design of the optical imaging arrangement.

One of the crucial accuracy requirements is the accuracy of the position of the image on the substrate, which is also referred to as the line of sight (LoS) accuracy. The line of sight accuracy typically scales to approximately the inverse of the numerical aperture. Hence, the line of sight accuracy is a factor of 1.4 smaller for an optical imaging arrangement with a numerical aperture NA=0.45 than that of an optical imaging arrangement with a numerical aperture of NA=0.33. Typically, the line of sight accuracy ranges below 0.5 nm for a numerical aperture of NA=0.45. If double patterning is also to be allowed for in the exposure process, then the accuracy would typically have to be reduced by a further factor of 1.4. Hence, in this case, the line of sight accuracy would range even below 0.3 nm.

Among others, the above leads to very strict requirements with respect to the relative position between the components participating in the exposure process. Furthermore, to reliably obtain high-quality semiconductor devices it is not only necessary to provide an optical system showing a high degree of imaging accuracy. It is also necessary to maintain such a high degree of accuracy throughout the entire exposure process and over the lifetime of the system. As a consequence, the optical imaging arrangement components, i.e. the mask, the optical elements and the wafer, for example, cooperating in the exposure process must be supported in a well defined manner in order to maintain a predetermined spatial relationship between the optical imaging arrangement components as well to provide a high quality exposure process.

To maintain the predetermined spatial relationship between the optical imaging arrangement components throughout the entire exposure process, even under the influence of vibrations introduced, among others, via the ground structure supporting the arrangement and/or via internal sources of vibration disturbances, such as accelerated masses (e.g. moving components, turbulent fluid streams, etc.), as well as the under the influence of thermally induced position alterations, it is necessary to at least intermittently capture the spatial relationship between certain components of the optical imaging arrangement and to adjust the position of at least one of the components of the optical imaging arrangement as a function of the result of this capturing process.

In conventional systems, this process of capturing the spatial relationship between components cooperating in the exposure process is done via a metrology system using a central support structure for the optical projection system and the substrate system as a common reference in order to be able to readily synchronize motion of the actively adjusted parts of the imaging arrangement.

On the other hand, an increase in the numerical aperture, typically, leads to an increased size of the optical elements used, also referred to as the optical footprint of the optical elements. The increased optical footprint of the optical elements used has a negative impact on their dynamic properties and the control system used to achieve the above adjustments. Furthermore, the increased optical footprint typically leads to larger light ray incidence angles. However, at such increased light ray incidence angles transmissivity of the multi-layer coatings typically used for generating the reflective surface of the optical elements is drastically reduced, obviously leading to an undesired loss in light power and an increased heating of the optical elements due to absorption. As a consequence, even larger optical elements have to be used in order to enable such imaging at a commercially acceptable scale.

These circumstances lead to optical imaging arrangements with comparatively large optical elements having an optical footprint of up to 1 m×1 m and which are arranged very close to each other with mutual distances ranging down to less than 60 mm. Typically, in such a system with high numerical aperture NA requiring extremely low distortions, the optical path length reaches more than 2 m, while the object to image shift reaches 50 cm and more. These core figures essentially determine the overall size of the support structure, such as optical elements support structure for the optical elements as well as the metrology support structure for the metrology system. Typically, the overall dimensions of the support structures roughly reach 2 m×1.2 m×1.5 m.

One problem arising from the above situation is that such large structures are generally less rigid. Such less rigid support structures not only contribute to further restrictions of adjustment control performance, but also to residual errors due to quasi-static deformations of the respective structure caused by residual low frequency vibration disturbances. Such residual low frequency vibration disturbances may still be present despite the fact that the respective support structure is supported in a vibration isolated manner. Hence, the negative effects of vibration disturbances become even more prominent.

One seemingly straightforward solution would be increasing the stiffness and, hence, the resonant frequency of the respective support structure. However, there are clear practical limits to such an approach. A crucial limitation is that methods for manufacturing such large structures from suitable materials required to achieve appropriate dynamic and thermal properties in such a high precision imaging arrangement are not readily available.

A further limitation in the ability to actively handle such residual low frequency vibration disturbances lies in the difficulties to practically capture such residual low-frequency accelerations at sufficient accuracy avoiding the negative effects of drift and noise, respectively.

SUMMARY OF THE INVENTION

It is thus an object of the invention to, at least to some extent, overcome the above disadvantages and to provide good and long term reliable imaging properties of an optical imaging arrangement used in an exposure process.

It is a further object of the invention to reduce the effort necessary for an optical imaging arrangement while at least maintaining the imaging accuracy of the optical imaging arrangement used in an exposure process.

It is a further object of the invention to reduce the negative influence on imaging quality of residual low-frequency vibration disturbances introduced into the optical system of an optical imaging arrangement.

These objects are achieved according to the invention which, according to one aspect, is based on the technical teaching that an overall reduction of the effort necessary for an optical imaging arrangement while at least maintaining the imaging accuracy of the optical imaging arrangement even under the presence of low-frequency vibration disturbances may be achieved if the metrology support structure is split into a plurality of smaller separate substructures supporting subgroups of the metrology devices used in the imaging system. Such a split in separate smaller substructures has the great advantage that these substructures, due to their reduced size, may be more easily designed as components of increased rigidity and, hence, increased resonant frequency. Such increased rigidity and resonant frequencies lead to lower susceptibility of these support structures to low-frequency vibration disturbances, strongly reduced quasi-static deformation of the respective support structure and, ultimately, improved imaging accuracy.

It should be noted that, in many cases, it may be necessary to provide some additional metrology arrangement determining the spatial relation between the metrology device subgroups supported by the respective metrology support substructures in all degrees of freedom (DOF) in space which are relevant for the imaging quality in the specific imaging process performed (i.e. in at least one or more degrees of freedom, typically in all six degrees of freedom). However, this additional metrology effort is largely outweighed by the benefit achieved due to the strongly reduced quasi-static deformation of the respective support substructure and its clear benefits in terms of imaging accuracy as well as the relaxation of the requirements regarding eventual vibration isolated support of the respective substructures.

Thus, according to a first aspect of the invention there is provided an optical imaging arrangement comprising an optical projection system and a support structure system. The optical projection system comprises a group of optical elements configured to transfer, in an exposure process using exposure light along an exposure light path, an image of a pattern of a mask onto a substrate. The support structure system comprises an optical element support structure and a metrology support structure. The optical element support structure supports the group of optical elements, while the metrology support structure supports a group of metrology devices associated to the group of optical elements and configured to capture status information representative of at least one of a position and an orientation of each of the optical elements in at least one degree of freedom up to all six degrees of freedom. The group of optical elements comprises a first optical element subgroup and a second optical element subgroup, while the group of metrology devices comprises a first metrology device subgroup associated to the first optical element subgroup and a second metrology device subgroup associated to the second optical element subgroup. The metrology support structure comprises a first metrology support substructure and a second metrology support substructure, the first metrology support substructure supporting the first metrology device subgroup, the second metrology support substructure supporting the second metrology device subgroup. The first metrology support substructure and the second metrology support structure are separately supported on a load bearing structure of the support structure system.

According to a second aspect of the invention there is provided a method of supporting a metrology system of an optical imaging arrangement, the optical imaging arrangement comprising an optical projection system with a group of optical elements configured to transfer, in an exposure process using exposure light along an exposure light path, an image of a pattern of a mask onto a substrate. The method comprises supporting a group of metrology devices separately from the group of optical elements, the group of metrology devices being associated to the group of optical elements and configured to capture status information representative of at least one of a position and an orientation of each of the optical elements in at least one degree of freedom up to all six degrees of freedom. The supporting the group of metrology devices comprises separately supporting, on a load bearing structure, a first metrology device subgroup of the group of metrology devices by a first metrology support substructure and a second metrology device subgroup of the group of metrology devices by a second metrology support substructure. The first metrology device subgroup is associated to a first optical element subgroup of the group of optical elements and the second metrology device subgroup is associated to a second optical element subgroup of the group of optical elements.

According to a third aspect of the invention there is provided an optical imaging arrangement comprising an optical projection system and a support structure system. The optical projection system comprises a group of optical elements configured to transfer, in an exposure process using exposure light along an exposure light path, an image of a pattern of a mask onto a substrate. The support structure system comprises an optical element support structure and a metrology support structure. The optical element support structure supports the group of optical elements, while the metrology support structure supports a group of metrology devices associated to the group of optical elements and configured to capture status information representative of at least one of a position and an orientation of each of the optical elements in at least one degree of freedom up to all six degrees of freedom. The group of optical elements comprises a first optical element subgroup and a second optical element subgroup. The group of metrology devices comprises a first metrology device subgroup associated to the first optical element subgroup and a second metrology device subgroup associated to the second optical element subgroup. The metrology support structure comprises a first metrology support substructure and a second metrology support substructure, the first metrology support substructure supporting the first metrology device subgroup on a load bearing structure, the second metrology support substructure supporting the second metrology device subgroup on the load bearing structure. The group of metrology devices comprises at least one reference metrology device configured to capture reference metrology information, the reference metrology information being representative of at least one of a reference position and a reference orientation between the first metrology support substructure and the second metrology support substructure in at least one degree of freedom up to all six degrees of freedom.

According to a fourth aspect of the invention there is provided a method of determining status information of a group of optical elements of an optical imaging arrangement using a metrology system, the optical imaging arrangement comprising an optical projection system with the group of optical elements configured to transfer, in an exposure process using exposure light along an exposure light path, an image of a pattern of a mask onto a substrate. The method comprises supporting a group of metrology devices separately from the group of optical elements, the group of metrology devices being associated to the group of optical elements and configured to capture status information representative of at least one of a position and an orientation of each of the optical elements in at least one degree of freedom up to all six degrees of freedom. The supporting the group of metrology devices comprises supporting, on a load bearing structure, a first metrology device subgroup of the group of metrology devices by a first metrology support substructure and a second metrology device subgroup of the group of metrology devices by a second metrology support substructure. The first metrology device subgroup is associated to a first optical element subgroup of the group of optical elements, while the second metrology device subgroup is associated to a second optical element subgroup of the group of optical elements. The method further comprises capturing reference metrology information via at least one reference metrology device of the group of metrology devices, the reference metrology information being representative of at least one of a reference position and a reference orientation between the first metrology support substructure and the second metrology support substructure in at least one degree of freedom up to all six degrees of freedom. The method further comprises determining the status information using the reference metrology information, and further metrology information provided by the group of metrology devices.

According to a fifth aspect of the invention there is provided an optical imaging method comprising transferring, in an exposure process using exposure light along an exposure light path, an image of a pattern of a mask onto a substrate using an optical imaging arrangement comprising a group of optical elements. During the exposure process, an active component of the optical imaging arrangement is controlled using status information of the group of optical elements using a method of determining status information of a group of optical elements according to the invention.

Further aspects and embodiments of the invention will become apparent from the dependent claims and the following description of preferred embodiments which refers to the appended figures. All combinations of the features disclosed, whether explicitly recited in the claims or not, are within the scope of the invention.

DETAILED DESCRIPTION OF THE INVENTION

First Embodiment

In the following, a preferred first embodiment of an optical imaging arrangement 101 according to the invention with which preferred embodiments of methods according to the invention may be executed will be described with reference to FIGS. 1 to 5. To facilitate understanding of the following explanations a xyz coordinate system is introduced in the Figures, wherein the z-direction designates the vertical direction (i.e. the direction of gravity).

Figure 1:
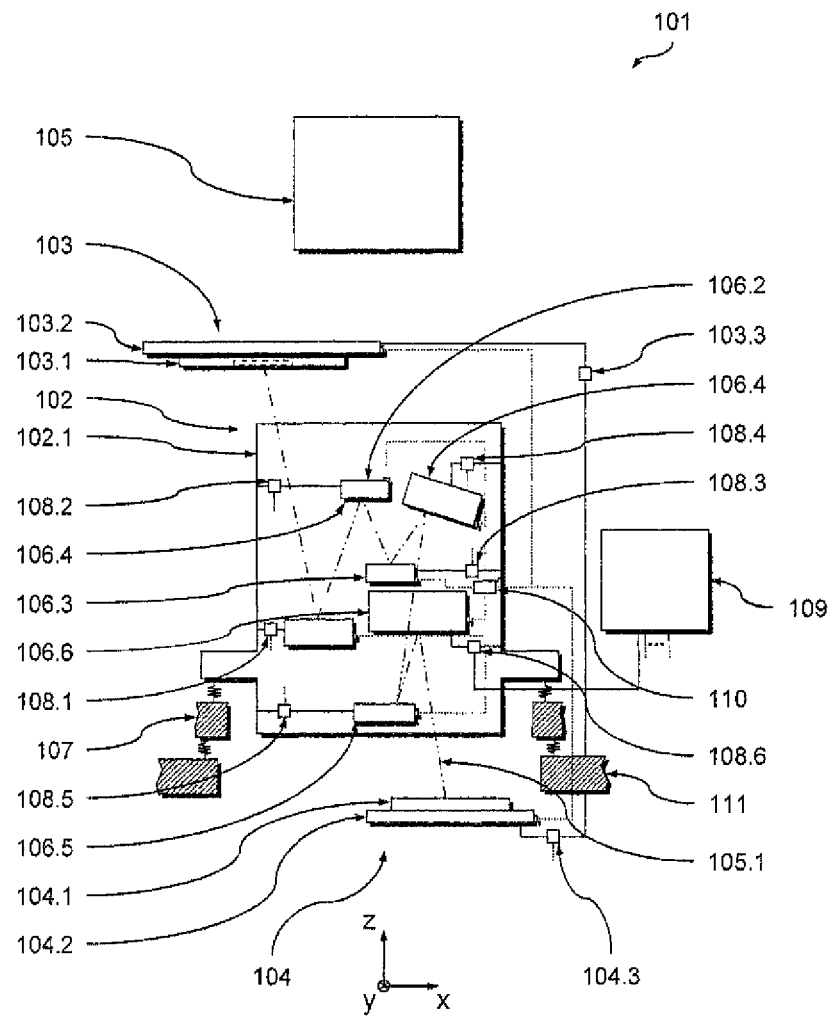
FIG. 1 is a schematic representation of a preferred embodiment of an optical imaging arrangement according to the invention with which preferred embodiments of methods according to the invention may be executed.

FIG. 1 is a highly schematic and not-to-scale representation of the optical imaging arrangement in the form of an optical exposure apparatus 101 operating in the EUV range at a wavelength of 13 nm. The optical exposure apparatus 101 comprises an optical projection unit 102 adapted to transfer an image of a pattern formed on a mask 103.1 (located on a mask table 103.2 of a mask unit 103) onto a substrate 104.1 (located on a substrate table 104.2 of a substrate unit 104). To this end, the optical exposure apparatus 101 comprises an illumination system 105 illuminating the reflective mask 103.1 via an appropriate light guide system (not shown). The optical projection unit 102 receives the light (represented by its chief ray 105.1) reflected from the mask 103.1 and projects the image of the pattern formed on the mask 103.1 onto the substrate 104.1, e.g. a wafer or the like.

To this end, the optical projection unit 102 holds an optical element unit group 106 of optical element units 106.1 to 106.6. This optical element unit group 106 is held within an optical element support structure 102.1. The optical element support structure 102.1 may take the form of a housing structure of the optical projection unit 102, which, in the following, is also referred to as the projection optics box structure (POB) 102.1. It will be appreciated, however, that this optical element support structure does not necessarily have to form a complete or even tight enclosure of the optical element unit group 106. Rather it may also be partially formed as an open structure as it is the case with the present example.

It will be appreciated that, in the sense of the present invention, an optical element unit may merely consist of an optical element, such as a mirror. However, such an optical element unit may also comprise further components such as a holder holding such an optical element.

The projection optics box structure 102.1 is supported in a vibration isolated manner on a load bearing structure 107, in turn, is supported on a ground or base structure 111. The load bearing structure 107 is supported on the ground or base structure 111 in a vibration isolated manner at a vibration isolation resonant frequency that ranges from 0.05 Hz to 8.0 Hz, preferably from 0.1 Hz to 1.0 Hz, more preferably from 0.2 Hz to 0.6 Hz. Furthermore, typically, a damping ratio is selected that ranges from 5% to 60%, preferably from 10% to 30%, more preferably from 20% to 25%. In the present example a vibration isolation resonant frequency of 0.25 Hz to 2 Hz at a damping ratio of 15% to 35% is selected for the vibration isolated support of the load bearing structure 107.

The ground or base structure 111 (in a vibration isolated manner) also supports the mask table 103.2 via a mask table support device 103.3 and the substrate table 104.2 via a substrate table support device 104.3. It will be appreciated however that, with other embodiments of the invention, the load bearing structure 107 may also support (preferably in a vibration isolated manner) the mask table 103.2 and the substrate table 104.2.

It will be appreciated that the projection optics box structure 102.1 may be supported in a cascaded manner via a plurality of vibration isolation devices and at least one intermediate support structure unit to achieve good vibration isolation. Generally, these vibration isolation devices may have different isolation frequencies to achieve good vibration isolation over a wide frequency range.

The optical element unit group 106 comprises a total of six optical element units, namely a first optical element unit 106.1, a second optical element unit 106.2, a third optical element unit 106.3, a fourth optical element unit 106.4, a fifth optical element unit 106.5 and a sixth optical element unit 106.6. In the present embodiment, each of the optical element units 106.1 to 106.6 consists of an optical element in the form of a mirror, also referred to as mirrors M1 to M6 in the following.

In the present embodiment, mirror 106.2 (M2), mirror 106.3 (M3) and mirror 106.4 (M4) form a first optical element subgroup 106.7 in the sense of the present invention, while mirror 106.1 (M1), mirror 106.5 (M5) and mirror 106.6 (M6) form a second optical element subgroup 106.8.

It will be appreciated however that, with other embodiments of the invention, (as mentioned above) the respective optical element unit may also comprise further components (beyond the optical element itself) such as, for example, aperture stops, holders or retainers holding the optical element and eventually forming an interface for the support unit connecting the optical element unit to the support structure.

It will be further appreciated that, with other embodiments of the invention, another number of optical element units may be used. Preferably, four to eight optical element units are provided.

Each one of the mirrors 106.1 (M1) to 106.6 (M6) is supported on the support structure formed by the projection optics box structure 102.1 by an associated support device 108.1 to 108.6. Each one of the support devices 108.1 to 108.6 is formed as an active device such that each of the mirrors 106.1 to 106.6 is actively supported at a defined control bandwidth.

In the present example, the optical element unit 106.6 is a large and heavy component forming a first optical element unit of the optical element unit group 106 while the other optical element units 106.1 to 106.5 form a plurality of second optical element units of the optical element unit group 106. The first optical element unit 106.6 is actively supported at a low first control bandwidth, while the second optical element units 106.1 to 106.5 are actively supported at a second control bandwidth to substantially maintain a given spatial relationship of each of the second optical element units 106.1 to 106.5 with respect to the first optical element unit 106.6 as it is disclosed in International Patent Application PCT/EP2012/053743 filed on Mar. 3, 2012 (the entire disclosure of which is incorporated herein by reference).

In the present example, a similar active support concept is chosen for the mask table support device 103.3 and the substrate table support device 104.3 both also actively supported at a third and fourth control bandwidth, respectively, to substantially maintain a given spatial relationship of the mask table 103.2 and the substrate table 104.2, respectively, with respect to the first optical element unit 106.6. It will be appreciated however that, with other embodiments of the invention, another support concept may be chosen for the mask table and/or the substrate table.

As will be explained in further detail below, control of the active support devices 108.1 to 108.6, 103.3 and 104.3 is performed by a control unit 109 as a function on the signals of a metrology arrangement 110. Adjustment control of the components participating in the imaging process is performed the following way.

To achieve the active low bandwidth support the first optical element unit 106.6, the first support device 108.6 of the first optical element unit 106.6 is configured and controlled to provide adjustment of the first optical element unit 106.6 with respect to a component of the metrology arrangement 110 at a first adjustment control bandwidth ranging from 5 Hz to 100 Hz, preferably from 40 Hz to 100 Hz.

Furthermore, to achieve the active support the second optical element units 106.1 to 106.5, the mask table 103.2 and the substrate table 104.2, respectively, each of the second support devices 108.1 to 108.5 of the second optical element units 106.1 to 106.5 as well as the mask table support device 103.3 and the substrate table support device 104.3, respectively, is configured and controlled to provide adjustment of the respective associated optical element unit 106.1 to 106.5, the mask table 103.2 and the substrate table 104.2, respectively, at a second, third and fourth adjustment control bandwidth, respectively, ranging from 5 Hz to 400 Hz, preferably from 200 Hz to 300 Hz. It will be appreciated that, with certain embodiments of the invention, the second control bandwidth may vary among the second support devices 108.1 to 108.5.

The present embodiment, compared to conventional designs, hence follows a modified support strategy according to which the large and heavy first optical element unit 106.6 posing the most severe problems in reaching the high control bandwidth typically required in EUV microlithography is actively supported in a controlled manner at a low bandwidth (at which control may be readily achieved for this optical element unit 106.6) while the other components participating in the exposure process, i.e. the second optical element units 106.1 to 106.5, the mask table 103.2 and the substrate table 104.2, are controlled to maintain a sufficiently stable and accurate spatial relation with respect to the first optical element unit 106.6 and, hence, with respect to each other.

Hence, despite the fact that, in the present example, all components participating in the imaging process (i.e. the mirrors 106.1 to 106.6, the mask 103.1 and the substrate 104.1) are actively controlled, the greatly relaxed requirements for the adjustment control bandwidth of the first optical element unit 106.6 largely outweigh the increased expense for the active support of the individual components. In particular, adjustment control of a large optical footprint component such as the sixth mirror 106.6 (which may have an optical footprint of up to 1.5 m×1.5 m and a mass of up to 350 kg) is greatly facilitated compared to conventional systems where, typically, an adjustment control bandwidth of 200 Hz to 300 Hz is used and considered necessary (a control bandwidth that can hardly be reached for such large optical footprint components due to their low resonant frequency).

The image of the pattern formed on the mask 103.1 is usually reduced in size and transferred to several target areas of the substrate 104.1. The image of the pattern formed on the mask 103.1 may be transferred to the respective target area on the substrate 104.1 in two different ways depending on the design of the optical exposure apparatus 101. If the optical exposure apparatus 101 is designed as a so called wafer stepper apparatus, the entire image of the pattern is transferred to the respective target area on the substrate 104.1 in one single step by irradiating the entire pattern formed on the mask 103.1. If the optical exposure apparatus 101 is designed as a so called step-and-scan apparatus, the image of the pattern is transferred to the respective target area on the substrate 104.1 by progressively scanning the mask table 103.2 and thus the pattern formed on the mask 103.1 under the projection beam while performing a corresponding scanning movement of the substrate table 104.2 and, thus, of the substrate 104.1 at the same time.

In both cases, a given spatial relationship between the components participating in the exposure process (i.e. between the optical elements of the optical element unit group 106, i.e. the mirrors 106.1 to 106.6, with respect to each other as well as with respect to the mask 103.1 and with respect to the substrate 104.1 has to be maintained within predetermined limits to obtain a high quality imaging result.

During operation of the optical exposure apparatus 101, the relative position of the mirrors 106.1 to 106.6 with respect to each other as well as with respect to the mask 103.1 and the substrate 104.1 is subject to alterations resulting from, both, intrinsic and extrinsic, disturbances introduced into the system. Such disturbances may be mechanical disturbances, e.g. in the form vibrations resulting from forces generated within the system itself but also introduced via the surroundings of the system, e.g. the load bearing structure 107 (which itself is supported on a ground structure 111). They may also thermally induced disturbances, e.g. position alterations due to thermal expansion of the parts of the system.

In order to keep the above predetermined limits of the spatial relation of the mirrors 106.1 to 106.6 with respect to each other as well as with respect to the mask 103.1 and the substrate 104.1, each one of the mirrors 106.1 to 106.6 is actively positioned in space via their support devices 108.1 to 108.6, respectively. Similarly, the mask table 103.2 and the substrate table 104.2 are actively positioned in space via the respective support devices 103.3 and 104.3, respectively.

In the following, the control concept for the spatial adjustment of the components 106.1 to 106.6, 103.1 and 104.1 participating in the imaging process will be described with reference to FIGS. 1 and 2. As mentioned above, control of the adjustment of the components 106.1 to 106.6, 103.1 and 104.1 in all six degrees of freedom is done using the control unit 109 connected and providing corresponding control signals to each one of the support devices 108.1 to 108.6, 103.3 and 104.3 (as it is indicated in FIG. 1 by the solid and dotted lines at the control unit 109 and the respective support device) at the specific adjustment control bandwidth as outlined above.

It will be appreciated however that, with other embodiments of the invention, it may not be necessary to provide active adjustment control in all six degrees of freedom for specific ones or even all the components participating in the imaging process. For example, given a specific design of the imaging arrangement with an imaging error behavior having a relevant sensitivity to alterations (of individual or even all components participating in the imaging process) only in certain degrees of freedom, it may be sufficient to only consider and, if necessary, control adjustment of the relevant components in these specific degrees of freedom, while other degrees of freedom, due to their lacking influence on imaging quality, may be neglected.

Figure 2:
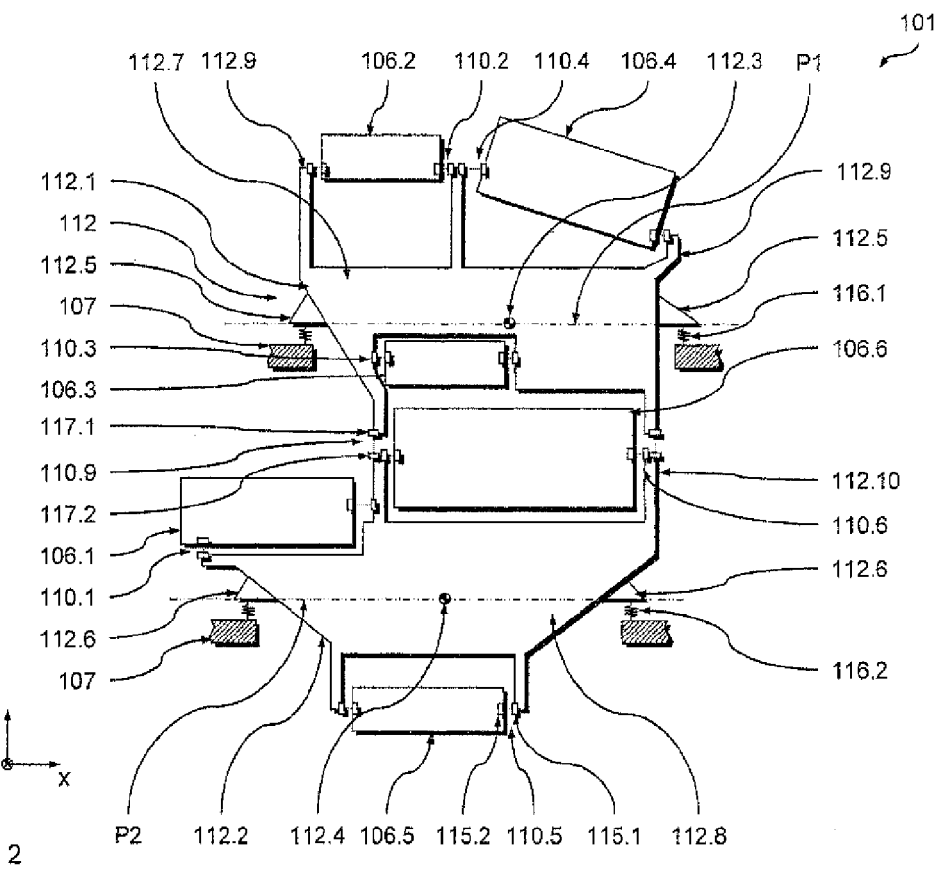
FIG. 2 is a schematic representation of a part of the optical imaging arrangement of FIG. 1.

In the present example, the control unit 109 generates its control signals as a function of the metrology signals of the metrology arrangement 110 which captures, as a status information in the sense of the present invention, an information representative of the position and orientation of each one of the components 106.1 to 106.6, 103.1 and 104.1 in all six degrees of freedom (as it is indicated by the dotted lines in FIGS. 1 and 2).

As mentioned above, the metrology arrangement 110 uses the large optical footprint sixth mirror 106.6 as an inertial reference (i.e. as a reference optical element unit) to which all further components 106.1 to 106.5, 103.1 and 104.1 participating in the imaging process are referred to. As can be seen from FIG. 1, the sixth mirror 106.6, in the light path, is the ultimate mirror unit hit last by the exposure light 105.1 when transferring the image of a pattern formed on the mask 103.1 onto the substrate 104.1.

To this end, the metrology arrangement 110 comprises a group of metrology devices 110.1 to 110.6 mechanically connected to a projection system metrology support structure 112 which in turn is supported by the load bearing structure 107 as well as further metrology devices 113 and 114 associated to the mask table 103.2 and the substrate table 104.2, respectively as it is (highly schematically) indicated in FIG. 1.

In the present embodiment, each metrology device 110.1 to 110.6 comprises a plurality of sensor heads 115.1 mechanically connected to the projection system metrology support structure 112, and cooperating with an associated reference element 115.2 mechanically connected directly to the respective mirror 106.1 to 106.6. Similar applies to the metrology devices 113 and 114, respectively.

The term "mechanically connected directly", in the sense of the invention, is to be understood as a direct connection between two parts including (if any) a short distance between the parts allowing to reliably determine the position of the one part by measuring the position of the other part. In particular, the term may mean without the interposition of further parts introducing uncertainties in the position determination, e.g. due to thermal or vibration effects. It will be appreciated that, with certain embodiments of the invention, the reference element 115.2 may not be a separate component connected to the mirror but many be directly or integrally formed on a surface of the mirror, e.g. as a grating or the like formed in a separate process upon manufacture of the mirror.

In the present embodiment, the metrology devices 110.1 to 110.6, 113 and 114 operate according to an encoder principle, i.e. the sensor head emits a sensor light beam towards a structured surface and detects a reading light beam reflected from the structured surface of the reference element. The structured surface may be, for example, a grating comprising a series of parallel lines (one-dimensional grating) or a grid of mutually inclined lines (two-dimensional grating) etc. Positional alteration is basically captured from counting the lines passed by the sensor beam which may be derived from the signal achieved via the reading beam.

It will be appreciated however that, with other embodiments of the invention, apart from the encoder principle any other type of contactless measurement principle (such as e.g. an interferometric measurement principle, a capacitive measurement principle, an inductive measurement principle etc) may be used alone or in arbitrary combination. However, it will also be appreciated that, with other embodiments of the invention, any suitable contact based metrology arrangement may be used as well. As contact based working principles magnetostrictive or electrostrictive working principles etc may be used for example. In particular, the choice of the working principle may be made as a function of the accuracy requirements.

The metrology device 110.6 associated to the sixth mirror 106.6 (M6), in all six degrees of freedom, captures the first spatial relationship between the projection system metrology support structure 112 and the sixth mirror 106.6 (M6) which forms the inertial reference. Furthermore, the metrology devices 110.1 to 110.5, 113 and 114 associated to the other components 106.1 to 106.5, 103.1 and 104.1 participating in the imaging process (in all six degrees of freedom) capture the second spatial relationship between the projection system metrology support structure 112.1 and the associated component 106.1 to 106.5, 103.1 and 104.1.

Finally, the metrology arrangement 110 determines the spatial relationship between the sixth mirror 106.6 and the respective further component 106.1 to 106.5, 103.1 and 104.1 using the first spatial relationship and the second spatial relationship. Corresponding metrology signals are then provided to the control unit 109 which in turn generates, as a function of these metrology signals, corresponding control signals for the respective support device 108.1 to 108.6, 103.3 and 104.3.

It will be appreciated that, with other embodiments of the invention, direct measurement of the spatial relation between the central reference element (e.g. the sixth mirror M6) and any one of the respective further component (e.g. mirrors 106.1 to 106.5, mask 103.1 and substrate 104.1) participating in the imaging process may also be provided. Depending on the spatial boundary conditions an arbitrary combination of such direct and indirect measurements may also be used.

In the embodiment shown, as a function of the metrology signals representative of the first spatial relationship between the metrology structure and the sixth mirror 106.6, the control unit 109 generates corresponding control signals for the support device 108.6 of the sixth mirror 106.6 (i.e. the reference element in the sense of the present invention) to adjust the sixth mirror 106.6 at the above first adjustment control bandwidth (ranging from 5 Hz to 100 Hz, preferably from 40 Hz to 100 Hz) with respect to the projection system metrology support structure 112 of the metrology arrangement 110.

This low bandwidth control of the critical first optical element unit 106.6 provides low bandwidth drift control of the first optical element unit 106.6 with respect to the metrology support structure 112. In other words, it allows the first optical element unit 106.6 to follow corresponding low-frequency motions of the metrology support structure 112 of the metrology device 110.6 capturing the spatial relationship between the first optical element unit 106.6 and the projection system metrology support structure 112. By this means excessive relative motion between the first optical element unit 106.6 and the projection system metrology support structure 112.1 of the metrology unit 110.1 going beyond the capturing range of the capturing devices of the metrology unit 110.1 or, in other words, sensor range problems may be avoided in a very beneficial way.

It will be appreciated that the spatial relationship between the substrate table 104.2 and the substrate 104.1 is known, e.g. due to a measurement operation immediately preceding the exposure process. The same applies to the spatial relationship between the mask table 103.2 and the mask 103.1. Hence, the respective reference element connected to the mask table 103.2 and the substrate table 104.2, respectively, also allows capturing the spatial relationship between the reference mirror 106.6 and the mask 103.1 and the substrate 104.1, respectively.

As a consequence, despite the fact that, typically, all components participating in the exposure process now have to be actively controlled, the requirements for the control bandwidth of the most critical first optical element unit 106.6 are greatly relaxed in a highly beneficial way. This positive effect, generally, largely outweighs the increased expense for the active support of all components.

Hence, for example, compared to conventional systems where, typically, an adjustment control bandwidth of 200 Hz to 300 Hz is used and considered necessary for each individual optical element unit, with the present invention a considerably lower adjustment control bandwidth, e.g. between 5 Hz to 100 Hz, preferably between 40 Hz to 100 Hz, may be used for the critical first optical element unit 106.6, while all other components participating in the imaging process (i.e. optical element units 106.1 to 106.5, mask unit 103.1 and substrate unit 104.1) may be readily controlled at the conventionally desired higher adjustment control bandwidth of, for example, 200 Hz to 400 Hz, to provide proper alignment with respect to the inertial reference formed by the first optical element unit 106.6.

It will be further appreciated that the above (indirect) measurement concept has the advantage that the instantaneous rigid-body position and orientation of the projection system metrology support structure of the metrology unit 110.1, in particular, vibration disturbances introduced into the metrology structure of the metrology unit 110.1, are essentially irrelevant as long as the projection system metrology support structure 112.1 is sufficiently rigid to largely avoid deformation of the metrology support structure 112. In particular, less effort has to be made for stabilizing the position and/or orientation of the projection system metrology support structure 112 in space. Typically, however, as in the present embodiment, the projection system metrology support structure 112 may nevertheless be supported in a vibration isolated manner.

According to the present invention, optical performance of the system 101 is further improved by further reducing or vastly eliminating the influence of low-frequency vibration leading to quasi-static deformation of the projection system metrology support structure 112 by splitting the projection system metrology support structure 112 into a plurality of separate metrology support substructures 112.1 and 112.2, each supporting a subgroup of the metrology devices 110.1 to 110.6, each subgroup of the metrology devices 110.1 to 110.6 being associated to a subgroup of the mirrors 106.1 to 106.6.

More precisely, as can be seen from FIG. 2 (showing only parts of the projection system 102 relevant in this context), in the present example, a first metrology device subgroup 110.7 (comprising metrology devices 110.2, 110.3 and 110.4) is associated to a first optical element subgroup 106.7 (comprising mirrors 106.2, 106.3 and 106.4) and is supported by a first metrology support substructure 112.1. A second metrology device subgroup 110.8 (comprising metrology devices 110.1, 110.5 and 110.6) is associated to a second optical element subgroup 106.8 (comprising mirrors 106.1, 106.5 and 106.6) and is supported by a second metrology support substructure 112.2.

This split of the projection system metrology support structure 112 into separate smaller substructures 112.1 and 112.2 has the great advantage that these substructures 112.1 and 112.2, due to their reduced size, may be more easily designed as components of increased rigidity and, hence, increased resonant frequency. Such increased rigidity and resonant frequencies of the substructures 112.1 and 112.2, compared to conventional single piece rigid structure designs of the projection system metrology support structure (where, for example, support structure 112 would be made of a monolithic component or from a plurality of rigidly connected components), lead to remarkably lower susceptibility of these support substructures 112.1 and 112.2 to low-frequency vibration disturbances.

Consequently, low-frequency vibration induced quasi-static deformation of the respective support substructure 112.1 and 112.2 is greatly reduced compared to conventional single piece rigid metrology support structure. This reduces measurement errors due to alterations of the position and/or orientation of the metrology devices 110.1 to 110.6 resulting from such quasi-static deformation of the projection system metrology support structure 112, which improves the measurement accuracy achieved with the metrology devices 110.1 to 110.6. This, ultimately, in a beneficial way leads to an improved accuracy of the control process and, hence, improved overall imaging accuracy of the imaging arrangement 101.

The first metrology support substructure 112.1 and the second metrology support structure 112.2, in the present example, are supported separately on the load bearing structure 107 in an individually vibration isolated manner. To this end, the first metrology support substructure 112.1 is supported on the load bearing structure 107 via a first vibration isolation device 116.1, while the second metrology support substructure 112.2 is supported on the load bearing structure 107 via a second vibration isolation device 116.2.

The first vibration isolation device 116.1 and the second vibration isolation device 116.2 each has a vibration isolation resonant frequency in a vibration isolation resonant frequency range from 0.5 Hz to 8.0 Hz. Preferably, the respective vibration isolation resonant frequency ranges from 1.0 Hz to 6.0 Hz, more preferably from 2.0 Hz to 5.0 Hz. Furthermore, typically, a damping ratio is selected that ranges from 5% to 60%, preferably from 10% to 30%, more preferably from 20% to 25%. In the present example a vibration isolation resonant frequency of 2.0 Hz to 6.0 Hz at a damping ratio of 15% to 35% is selected for the first vibration isolation device 116.1 and the second vibration isolation device 116.2. With these frequency ranges and damping ratios particularly good low-frequency vibration isolation of the respective metrology support substructure 112.1 and 112.2 is achieved, further beneficially reducing the influence of low-frequency vibration.

It is particularly advantageous to introduce the support forces into the respective metrology support substructure 112.1 and 112.2 as close to its mass center of gravity 112.3 and 112.4, respectively, as possible. Such a support typically leads to reduced low-frequency vibration amplitudes.

Hence, to achieve a particularly good low-frequency vibration behavior of the respective metrology support substructure 112.1 and 112.2, in the present example, the first metrology support substructure 112.1 has a plurality of first load bearing interface devices 112.5 contacting the first vibration isolation device 116.1 and, hence, serving to introduce support forces into the first metrology support substructure 112.1 when supporting the latter on the load bearing structure 107.

Furthermore, the second metrology support substructure 112.2 has a plurality of second load bearing interface devices 112.6 contacting the second vibration isolation device 116.2 and, hence, serving to introduce support forces into the second metrology support substructure 112.2 when supporting the latter on the load bearing structure 107.

To achieve the beneficial support as outlined above, the first load bearing interface devices 112.5 are arranged such that they define a first load bearing interface plane P1, which is located to substantially coincide with the mass center of gravity 112.3 of the first metrology support substructure 112.1. Likewise, the second load bearing interface devices 112.6 are arranged such that they define a second load bearing interface plane P2, which is located to substantially coincide with the mass center of gravity 112.4 of the second metrology support substructure 112.2.

It should be noted that the separate (preferably vibration isolated) support of the metrology support substructures 112.1 and 112.2, during operation of the optical imaging apparatus 101, typically, will lead to a drift between the separate metrology support substructures 112.1 and 112.2 and, hence, between the respective metrology device subgroups 110.7 and 110.8 supported thereon in one or more degrees of freedom which are relevant to the imaging error of the optical imaging apparatus 101.

Consequently, in many cases, it may be necessary to provide some additional metrology arrangement determining the spatial relation between the metrology device subgroups supported by the respective metrology support substructures in all degrees of freedom (DOF) in space which are relevant for the imaging quality in the specific imaging process performed with the imaging apparatus 101 (i.e. in at least one or more degrees of freedom, typically in all six degrees of freedom).

However, as mentioned above, this additional effort for the metrology system is largely outweighed by the benefit achieved due to the strongly reduced quasi-static deformation of the respective support substructure 112.1 and 112.2 and its clear benefits in terms of imaging accuracy as well as the relaxation of the requirements regarding eventual vibration isolated support of the respective substructures.

Figure 3:
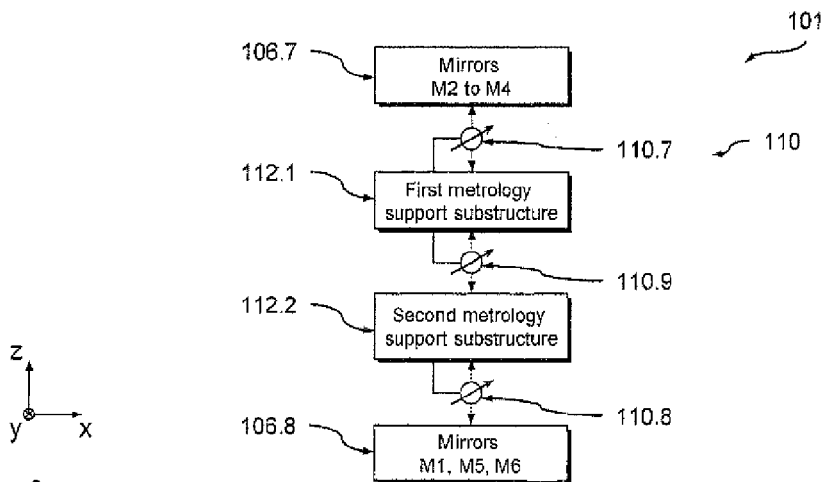
FIG. 3 is a mechanical block diagram of the part of the optical imaging arrangement of FIG. 2.

Hence, as can be seen from FIGS. 2 and 3, in the present embodiment, there is provided a reference metrology device 110.9 configured to capture reference metrology information representative of the relative position (also referred to as the reference position) and the relative orientation (also referred to as the reference orientation) between the first metrology support substructure 112.1 and the second metrology support substructure 112.2 in all six degrees of freedom.

Using this reference metrology information, the control unit 109 (under the assumption of infinitely rigid first and second metrology support substructures 112.1 and 112.2) may calculate the actual relative position and relative orientation of all the metrology devices 110.1 to 110.6 in all six degrees of freedom.

As can be seen from FIG. 2, the reference metrology device 110.9 comprises a first reference metrology unit 117.1 and a second reference metrology unit 117.2 configured to cooperate in providing this reference metrology information. More precisely, the first reference metrology unit comprises a plurality of sensor heads 117.1 mechanically connected to the first metrology support substructure 112.1 each of which cooperates with an associated reference element 117.2 of the second reference metrology unit mechanically connected directly to the second metrology support substructure 112.2.

The sensor heads 117.1 and the associated reference elements 117.2 are designed in the same manner and provide the same functionality as the sensor heads 115.1 and reference elements 115.2 as described above. Hence, to avoid repetitions, reference is made to the explanations given above in the context of these components 115.1 and 115.2.

It will be appreciated that, here as well, with other embodiments of the invention, apart from the encoder principle, any other type of contactless measurement principle (such as e.g. an interferometric measurement principle, a capacitive measurement principle, an inductive measurement principle etc) may be used alone or in arbitrary combinations. However, it will also be appreciated that, with other embodiments of the invention, any suitable contact based metrology arrangement may be used as well. As contact based working principles magnetostrictive or electrostrictive working principles etc may be used for example. In particular, the choice of the working principle may be made as a function of the accuracy requirements.

As can be further seen from FIG. 2, the split design of the projection system metrology support structure 112, compared to conventional single piece rigid body designs, allows a comparatively lightweight design where the respective first and second metrology support substructure 112.1 and 112.2 only comprises a core structure and a plurality of support arms protruding from this core structure.

More precisely, the first metrology support substructure 112.1 comprises a first core structure 112.7, while the second metrology support substructure 112.2 comprises a second core structure 112.8. The first core structure 112.7 carries a plurality of first support arms 112.9, while the second core structure 112.8 carries a plurality of second support arms 112.10.

Each of the first support arms 112.9, in the region of its free end, carries one or more of the sensor heads 115.1 of the first metrology device subgroup 110.7. In order to provide a good dynamic behavior and, hence, a highly stable support of the sensor heads 115.1, each first support arm 112.9 is designed as a comparatively short and rigid component.

To this end, each first support arm 112.9 has a first maximum arm dimension which ranges from 5% to 150% of a first maximum core structure dimension of the first core structure 112.7. Preferably, the first maximum arm dimension ranges from 20% to 120% of the first maximum core structure dimension, more preferably from 30% to 100% of the first maximum core structure dimension.

Similar applies to the respective second support arm 112.10. Hence, preferably, each second support arm 112.10 has a second maximum arm dimension which ranges from 5% to 150% of a second maximum core structure dimension of the second core structure 112.8. Preferably, the second maximum arm dimension ranges from 20% to 120% of the second maximum core structure dimension, more preferably from 30% to 100% of the second maximum core structure dimension.

Apparently, compared to conventional designs, with this split design of the metrology support structure 112, in particular, in the central region where the two metrology substructures 112.1 and 112.2 are located adjacent to each other, a considerable amount of structural components or materials may be omitted. There is only a need for the respective core structure 112.7 and 112.8, respectively, to provide basic structural stability of the respective metrology support substructure 112.1 and 112.2, while, apart from the comparatively slender and lightweight but highly rigid support arms 112.9 and 112.10, respectively, any further structural elements or components may be dispensed with. Hence, compared to conventional single piece designs, a considerably more lightweight and, ultimately, more rigid structure may be achieved.

As becomes further apparent from FIG. 2, the project system metrology support structure 112 defines a set of three orthogonal directions, namely width direction (x-axis), the depth direction (y-axis) and the height direction (z-axis). Apparently, the height dimension of the projection system metrology support structure 112 is the maximum dimension of the projection system metrology support structure 112 in one of these three orthogonal directions. Hence, the height direction represents a direction of maximum dimension in the sense of the present invention.

According to the present invention, preferably and as in the present example, the split line between the metrology support substructures 112.1 and 112.2 is selected such that the first metrology support substructure 112.1 and the second metrology support substructure 112.2 are located mutually adjacent in this direction of maximum dimension.

Consequently, in the present example, the first metrology support substructure 112.1, in the height direction (being the direction), is located above the second metrology support substructure.

It will be appreciated however that, with other embodiments of the invention, another location of the split line between the metrology support substructures may be selected. For example, in the most prominent dimension of the metrology support structure was in the width direction (i.e. the x-axis being the direction of maximum dimension) and/or in the depth direction (i.e. the y-axis being the direction of maximum dimension), the split would preferably be such that the first and second metrology support substructure are located side-by-side at the same height level.

As can be seen from FIG. 2, the first metrology support substructure 112.1 and the second metrology support substructure 112.2, respectively, in the height direction (i.e. in the direction of the z-axis being the direction of maximum dimension), has a dimension that is only a fraction of its dimension in the other two orthogonal directions (i.e. in the direction of the x-axis and of the y-axis). Preferably, this fraction ranges from 20% to 80%, more preferably from 30% to 70%, even more preferably from 40% to 60%, thereby achieving a good compromise between structural stability and lightweight design.

It will be appreciated that any desired and appropriate material may be selected for the respective support structure, in particular for the projection system metrology support structure 112. For example, metals like aluminum may be used for the respective support structure, in particular, for support structures requiring a comparatively high rigidity at a comparatively low weight. It will be appreciated that the material for the support structures is preferably selected depending on the type or function of the support structure.

In particular, for the projection optics box structure 102.1 steel, aluminum (Al), titanium (Ti), so called Invar-alloys (i.e. iron nickel alloys with 33% to 36% of Ni, e.g. Fe64Ni36) and appropriate tungsten alloys (such as e.g. DENSIMET® and INERMET® composite materials, i.e. heavy metals with a tungsten content greater than 90% and a NiFe or NiCu binder phase) are preferably used.

Furthermore, for the projection system metrology support structure 112 materials such as silicon infiltrated silicon carbide (SiSiC), silicon carbide (SiC), silicon (Si), carbon fiber reinforced silicon carbide (C/CSiC), aluminum oxide ($Al_2O_3$), Zerodur® (a lithium aluminosilicate glass-ceramic), ULE® glass (a titania silicate glass), quartz, Cordierite (a magnesium iron aluminium cyclosilicate) or another ceramic material with low coefficient of thermal expansion and high modulus of elasticity may also be beneficially used.

In the present example, the projection optics box structure 102.1 is made from steel as a first material having a first rigidity. By this means, compared to conventional support structures being made, for example, from aluminum, the weight increases by a factor of three, what would typically not be favored in conventional systems. However, due to the non-conventional support strategy followed in the present example, the increased weight of the projection optics box structure 102.1 is beneficial in terms of the vibration behavior.

Furthermore, the projection metrology support structure 112 is made from a second material having a second rigidity that is higher than the first rigidity of the steel material of the projection optics box structure 102.1. Such a high rigidity of the projection metrology support structure 112.1 is beneficial as it has been outlined above.

It will be appreciated that, with the microlithography apparatus 101 of the present embodiment, a line of sight accuracy may be obtained which is below 100 pm in all the relevant degrees of freedom, typically in the x direction and the y direction.

Figure 4:
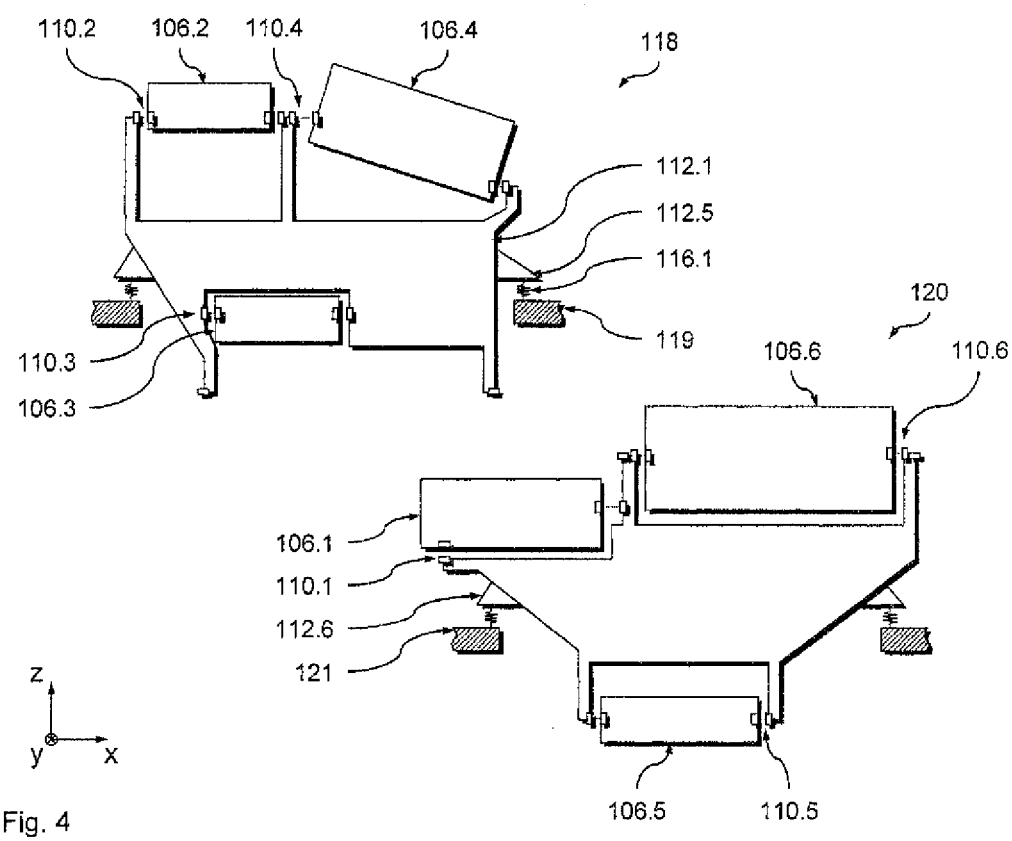
FIG. 4 is a schematic representation of the part of the optical imaging arrangement of FIG. 2 in a pre-assembled testing state.
Figure 5:
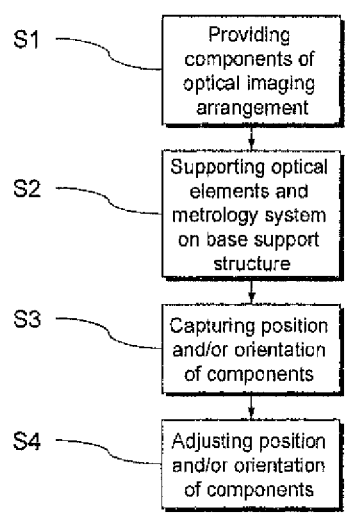
FIG. 5 is a block diagram of a preferred embodiment of a method of determining status information of a group of optical elements according to the invention including a preferred embodiment of a method of supporting a metrology system according to the invention which may be executed with the optical imaging arrangement of FIG. 1.

As becomes apparent from FIG. 4, with the split design of the projection system metrology support structure 112 according to the present invention, it is possible to implement a pretesting routine for the first and second metrology device subgroups 106.7 and 106.8 mounted to the respective first and second metrology support substructure 112.1 and 112.2.

This may be done in a first testing assembly 118 where the mirrors 106.2, 106.3 and 106.4 of the first optical element group 106.7 already including all the reference elements 115.2 are mounted to a testing support structure (not shown) identical to the corresponding part of the projection optics box structure 102.1. The fully preassembled first metrology support substructure 112.1 including all components of the first metrology device subgroup 110.7 is then supported on a test load bearing structure 119 identical to the load bearing structure 107.

The same applies to a second testing assembly 120 where the mirrors 106.1, 106.5 and 106.6 of the second optical element group 106.8 already including all the reference elements 115.2 are mounted to a testing support structure (not shown) identical to the corresponding part of the projection optics box structure 102.1. The fully preassembled second metrology support substructure 112.2 including all components of the second metrology device subgroup 110.8 is then supported on a test load bearing structure 121 identical to the load bearing structure 107.

In a test procedure a testing routine is run on the first and second metrology device subgroups 106.7 and 106.8 under real operating conditions. The split design of the projection system metrology support structure 112 provides easy accessibility to centrally located metrology devices such as, in particular, the third mirror 106.3 (M3) and the sixth mirror 106.6 (M6) which, in a conventional single piece design of the metrology support structure would (if at all) only hardly be accessible. This greatly facilitates adjustment and calibration of the metrology device subgroups 106.7 and 106.8.

With the optical imaging apparatus 101 of FIGS. 1 and 2 a method of transferring an image of a pattern onto a substrate may be executed using a preferred embodiment of a method of determining status information of the optical elements of an optical projection system using a method of supporting a metrology system according to the invention as it will be described in the following with reference to FIGS. 1 to 5.

In a transferring step of this method, an image of the pattern formed on the mask 103.1 is transferred onto the substrate 104.1 using the optical projection unit 102 of the optical imaging arrangement 101.

To this end, in a capturing step S3 of the transferring step, the spatial relationship between the components 106.1 to 106.6, 103.1 and 104.1 participating in the imaging process is captured using a method of capturing a spatial relationship between an optical element unit and a reference unit as a status information as it has been outlined above. During this capturing step S3 the metrology devices 110.1 to 110.6 are supported using a method according to the invention as it has also been outlined above.

In a controlling step S4 of the transferring step, the position and/or orientation of the substrate table 104.2, the mask table 103.2 and the other mirrors 106.1 to 106.5 with respect to the sixth mirror 106.6 as well as the position and/or orientation of the sixth mirror 106.6 with respect to the metrology structure of the metrology unit 110.1 is controlled as a function of the spatial relationship previously captured in the capturing step S3 as it has been outlined above. In an exposure step, immediately following or eventually overlapping the controlling step S4, the image of the pattern formed on the mask 103.1 is then exposed onto the substrate 104.1 using the optical imaging arrangement 1.

In a partial step of the controlling step S4, the mask unit 103 with the mask 103.1 and the substrate unit 104 with the substrate 104.1 previously provided are adjusted in space. It will be appreciated that the mask 103.1 and the substrate 104.1 may also be inserted into the mask unit 103 and the substrate unit 104, respectively, at a later point in time prior to the actual position capturing or at an even later point in time prior to the exposure step.

According to a preferred embodiment of a method of supporting components of an optical projection unit according to the invention, in a step S1, the components of the optical projection unit 102 are first provided and then supported in a step S2 as it has been outlined above. To this end, in the step S2, the mirrors 106.1 to 106.6 of the optical projection unit 102 are supported and positioned within the projection optics box structure 102.1 of the optical projection unit 102. In step S4, the mirrors 106.1 to 106.6 are then actively supported at the respective control bandwidth in the projection optics box structure 102.1 to provide a configuration as it has been described above in the context of FIGS. 1 and 2.

In the capturing step S3 the metrology arrangement 110 (previously provided in a configuration as it has been described above in the context of FIGS. 1 to 4) is used. It will be appreciated that the reference elements 115.2 may already have been provided at an earlier point in time together with the respective mirror 106.1 to 106.6 on which they are located. However, with other embodiments of the invention, the reference elements 115.2 may be provided together with the other components of the metrology arrangement 110 at a later point in time prior to the actual position capturing.

In the capturing step S3, the actual spatial relationship between the sixth mirror 106.6 as a central inertial reference of the optical imaging arrangement 101 and the substrate table 104.2, the mask table 103.2 as well as the other mirrors 106.1 to 106.5 is then captured as it has been outlined above.

It will be appreciated that the actual spatial relationship between the sixth mirror 106.6 and the substrate table 104.2, the mask table 103.2 and the other mirrors 106.1 to 106.5 as well as the actual spatial relationship of the sixth mirror 106.6 with respect to the metrology support structure 112 and the actual spatial relationship between the metrology support substructures 112.1 and 112.2 may be captured continuously throughout the entire exposure process. In the controlling step S4, the most recent result of this continuous capturing process is then retrieved and used.

As described above, in the controlling step S4, the position of the substrate table 104.2, the mask table 103.2 and the mirrors 106.1 to 106.6 is then controlled as a function of this spatial relationship previously captured before, in the exposure step, the image of the pattern formed on the mask 103.1 is exposed onto the substrate 104.1.

Second Embodiment

In the following, a second preferred embodiment of an imaging arrangement 201 according to the invention with which preferred embodiments of the methods according to the invention may be executed will be described with reference to FIGS. 6 and 7. The optical imaging arrangement 201 in its basic design and functionality largely corresponds to the optical imaging arrangement 101 such that it is here mainly referred to the differences. In particular, identical components have been given the identical reference, while like components are given the same reference numeral increased by the value 100. Unless explicitly deviating statements are given in the following, explicit reference is made to be explanations given above in the context of the first embodiment with respect to these components.

The only difference between the optical imaging arrangement 201 and the optical imaging arrangement 101 lies within the deviating concept of using the reference metrology device 210.9 of the metrology arrangement 210. It will be appreciated that the metrology arrangement 210 may simply replace the metrology arrangement 110 in the optical imaging arrangement 101.

Figure 6:
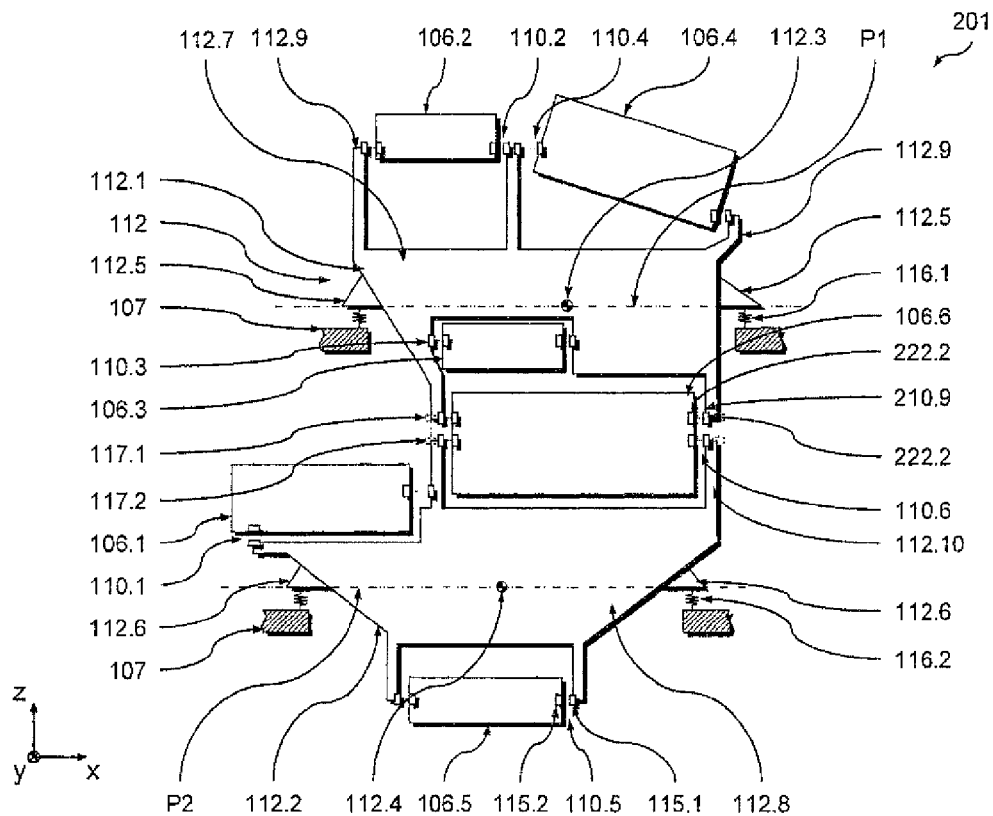
FIG. 6 is a schematic representation of a part of a further preferred embodiment of an optical imaging arrangement according to the invention with which further preferred embodiments of methods according to the invention may be executed.
Figure 7:
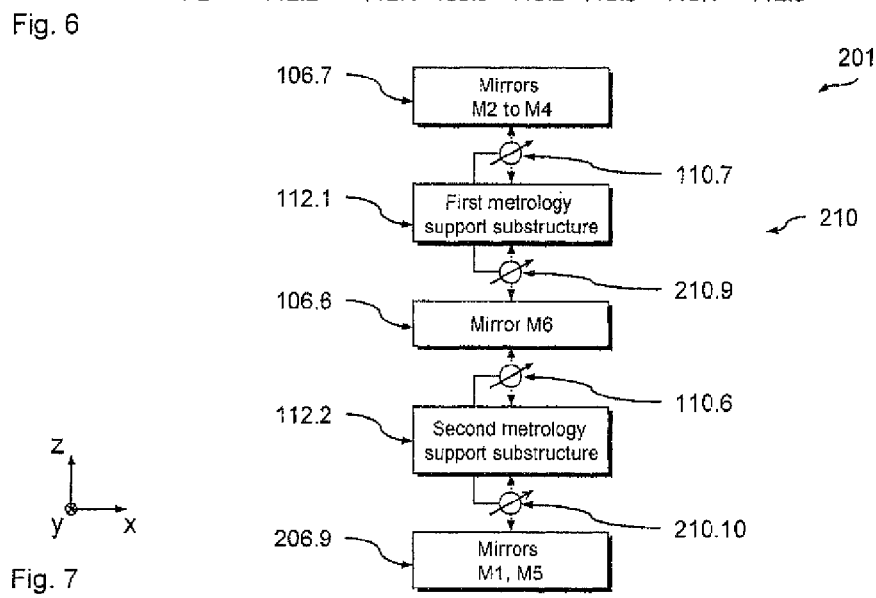
FIG. 7 is a mechanical block diagram of the part of the optical imaging arrangement of FIG. 6.

As can be seen from FIGS. 6 and 7, instead of directly capturing the relative position and relative orientation between the first metrology support substructure 112.1 and the second metrology support substructure 112.2 (using a reference metrology unit having sensor heads 117.1 connected to the first metrology support substructure 112.1 and associated reference elements 117.2 connected to the second metrology support substructure 112.2) the determination of the relative position and relative orientation between the first metrology support substructure 112.1 and the second metrology support substructure 112.2 in all six degrees of freedom is done in an indirect way.

To this end, the reference metrology device 210.9 comprises a first relative reference metrology unit formed by a plurality of sensor heads 222.1, a second relative reference metrology unit formed by a plurality of associated reference elements 222.2, a third relative reference metrology unit formed by the sensor heads 115.1 of the sixth metrology device 110.6 and a fourth relative reference metrology unit formed by the associated reference elements 115.2 of the sixth metrology device 110.6.

The sensor heads 222.1 of the first relative reference metrology unit are connected to the first metrology support substructure 112.1, while the associated reference elements 222.2 of the second relative reference metrology unit are connected to the sixth mirror 106.6 (M6) forming a reference unit in the sense of the present invention. The sensor heads 222.1 and the associated reference elements 222.2 cooperate in the same manner as the sensor heads 115.1 and the associated reference elements 115.2 as it has been outlined in greater detail above. Hence, in this respect, reference is only made to the explanations given above in the context of the first embodiment.

Thus, the sensor heads 222.1 of the first relative reference metrology unit and the associated reference elements 222.2 of the second relative reference metrology unit cooperate to provide first relative reference metrology information representative of a first relative position (also referred to as first relative reference position) and a first relative orientation (also referred to as first relative reference orientation) between the first metrology support substructure 112.1 and the sixth mirror 106.6 (M6) in all six degrees of freedom.

The sixth metrology device 110.6 operates in the same manner as described in the context of the first embodiment. Hence, the third relative reference metrology unit formed by the sensor heads 115.1 of the sixth metrology device 110.6 and the fourth relative reference metrology unit formed by the associated reference elements 115.2 of the sixth metrology device 110.6 also cooperate to provide second relative reference metrology information representative of a second relative position (also referred to as second relative reference position) and a second relative orientation (also referred to as second relative reference orientation) between the second metrology support substructure 112.2 and the sixth mirror 106.6 (M6) in all six degrees of freedom.

The control unit 109 then derives the reference metrology information (representative of the relative position and orientation of the first and second metrology support substructure 112.1 and 112.2 in all six degrees of freedom) from the first relative reference metrology information and the second relative reference metrology information.

It will be appreciated that, with other embodiments of the invention, the reference unit does not necessarily have to be the largest and most inert optical element of the optical system. Rather, any other suitable, preferably sufficiently dynamically stabilized component of the imaging apparatus may be used. Preferably, the reference unit is formed by any such suitable component external to the metrology support structure 112. For example, as mentioned it may one of the optical elements of the optical projection system. In addition to this alternative, preferably, the reference unit is the optical element of the optical projection system which is supported to exhibit maximum inertia (and hence tends to be the dynamically most stabilized component) among the optical elements.

Preferably, the reference unit it is formed by a component of the imaging apparatus which results in the least average of metrology or sensor cascades (over the entire optical projection system) necessary to determine the relative position and orientation between all optical elements of the optical projection system in all six degrees of freedom.

It will be appreciated that, the remaining outlay of the metrology system 210 is identical to the metrology system 110 of the first embodiment. Hence, the first metrology support substructure 112.1 further carries the first metrology device subgroup 110.7 associated to the first optical element subgroup 106.7. The second metrology support substructure 112.2 carries a second relative reference metrology unit formed by metrology device 110.6 associated to the central reference unit (formed by the optical element 106.6) as well as a metrology device subgroup 210.10 (of the second metrology device subgroup 110.8) associated to the remaining optical element subgroup 206.9 of the second optical element subgroup 106.8.

To keep the sensitivity of the metrology system 110 to deformations of the reference unit formed by the sixth mirror 106.6 (M6) as low as possible, the fourth relative reference metrology unit (formed by the sensor heads 115.1) and spatially associated second relative reference metrology unit (formed by the sensor heads 222.1) are located as close together as possible. Preferably, they are located at a distance which ranges from 0% to 20% of a maximum dimension of the reference unit 106.6. Preferably the distance ranges from 0% to 10%, more preferably from 0% to 5% of this maximum dimension of the reference unit 106.6. In any case, preferably the absolute distance ranges from 0 mm to 80 mm, preferably from 0 mm to 50 mm, more preferably from 0 mm to 20 mm.

it will be appreciated that, with certain embodiments of the invention, in certain degrees of freedom, the indirect determination of the relative position and/or orientation information as described in the context of the present embodiment may also be combined with the direct determination as described in the context of the first embodiment. To this end, sensor heads 117.1 and associated reference elements 117.2 may be used for certain degrees of freedom as is indicated by the dashed contours in FIG. 6.

It will be further appreciated that, with the microlithography apparatus 201 of the present embodiment, a line of sight accuracy may be obtained which is below 100 pm in all the relevant degrees of freedom, typically in the x direction and the y direction.

It will be further appreciated that, here as well, the methods according to the invention as described above in the context of FIG. 5 may also be executed with the microlithography apparatus 201.

Third Embodiment

In the following, a third preferred embodiment of an optical imaging arrangement 301 according to the invention with which preferred embodiments of the methods according to the invention may be executed will be described with reference to FIG. 8. The optical imaging arrangement 301 in its basic design and functionality largely corresponds to the optical imaging arrangement 201 such that it is here mainly referred to the differences. In particular, identical components have been given the identical reference, while like components are given the same reference numeral increased by the value 100. Unless explicitly deviating statements are given in the following, explicit reference is made to be explanations given above in the context of the second embodiment with respect to these components.

The main difference between the optical imaging arrangement 201 and the optical imaging arrangement 301 lies within the deviating split design of the projection system metrology support structure 312. As can be seen from FIG. 8, the projection system metrology support structure 312 is split into three substructures, namely a first metrology support substructure 312.1, a second metrology support substructure 312.2, and a third metrology support substructure 312.11.

As in the second embodiment, the first metrology support substructure 312.1 carries a first metrology device subgroup 310.7 associated to a first optical element subgroup 306.7 as well as a first relative reference metrology unit 310.9 associated to a central reference unit formed by an optical element 306.6 of a second optical element group 306.8.

Also similar to the second embodiment, the second metrology support substructure 312.2 carries a second relative reference metrology unit 310.6 associated to the central reference unit formed by the optical element 306.6 as well as a second metrology device subgroup 310.10 associated to the remaining optical element(s) 306.9 of the second optical element subgroup 306.8.

Furthermore, in a manner similar to the first embodiment, the second metrology support substructure carries a further reference metrology unit 310.11 determining the relative position and orientation between the second metrology support substructure 312.2 and the third metrology support substructure 312.11 in all six degrees of freedom (in the same manner as it has been described above in the context of the first embodiment for the reference metrology unit 110.9).

Finally, the third metrology support substructure carries a third metrology device subgroup 310.12 associated to a third optical element subgroup 306.10 and determining the relative position and orientation between the third metrology support substructure 312.11 and the optical elements of the third optical element subgroup 306.10 in all six degrees of freedom.

Figure 8:
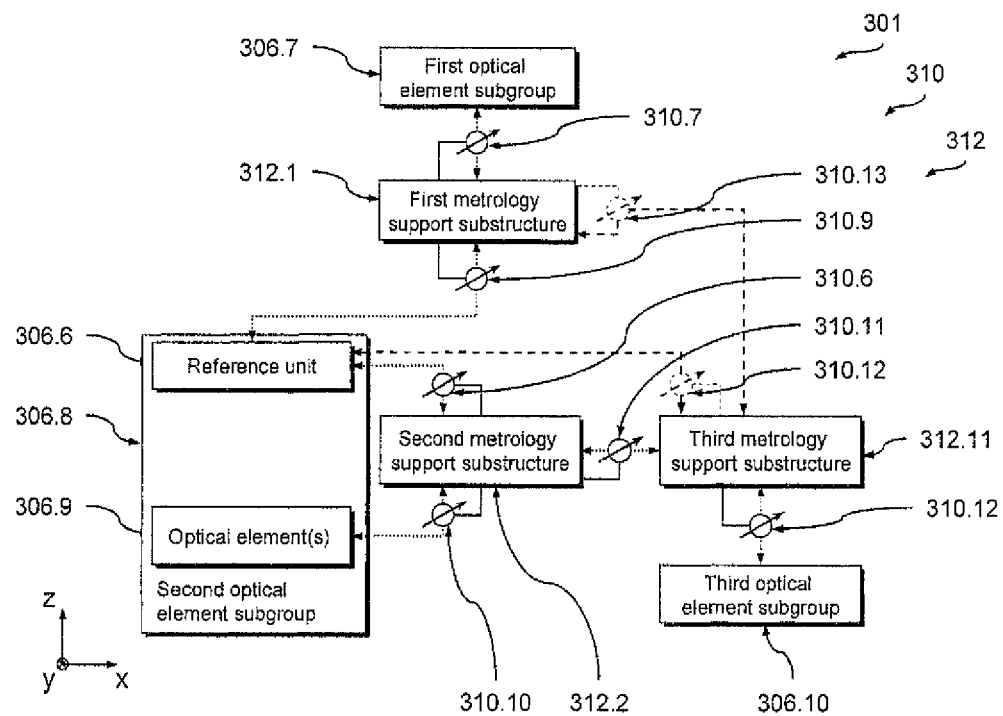
FIG. 8 is a mechanical block diagram of a part of a further preferred embodiment of an optical imaging arrangement according to the invention.

As an alternative, as indicated by the dashed contour 310.13 in FIG. 8, the reference metrology unit 310.11 may be omitted and the third metrology support substructure may carry a further reference metrology unit 310.13 determining the relative position and orientation between the third metrology support substructure 312.11 and the central reference unit formed by the optical element 306.6 in all six degrees of freedom (in the same manner as it has been described above in the context of the second embodiment for the reference metrology unit 210.9).

Finally, as a further alternative, as indicated by the dashed contour 310.13 in FIG. 8, the reference metrology unit 310.11 may be omitted and the first metrology support substructure 312.1 (or the third metrology support substructure 312.11) may carry a further reference metrology unit 310.13 determining the relative position and orientation between the third metrology support substructure 312.11 and first metrology support substructure 312.1 in all six degrees of freedom (in the same manner as it has been described above in the context of the first embodiment for the reference metrology unit 110.9).

As with all the other embodiments, the third metrology support substructure 312.11 is supported in a vibration isolated manner separately from the first and second metrology support substructures 312.1 and 312.2 on a load bearing structure (not shown).

It will be appreciated that, any desired number of optical elements may be used. For example, in the present embodiment, an optical element group 306 comprising eight optical elements may be provided. Furthermore, in the present embodiment, as highly schematically indicated in FIG. 8, the split between the first and second metrology support substructure 312.1 and 312.2 is such that they are located above each other in the height direction (z-axis), while the split between the second and third metrology support substructure 312.2 and 312.11 is such that they are located adjacent to each other (at substantially the same height level) in the horizontal plane (xy-plane). Furthermore, it will be appreciated that, with other embodiments of the invention, any other split into any desired number of metrology support substructures may be chosen.

It will be appreciated that, with the microlithography apparatus 301 of the present embodiment, a line of sight accuracy may be obtained which is below 1 nm in all the relevant degrees of freedom, typically in the x direction and the y direction.

Fourth Embodiment

In the following, a fourth preferred embodiment of an optical imaging arrangement 401 according to the invention with which preferred embodiments of the methods according to the invention may be executed will be described with reference to FIG. 9. The optical imaging arrangement 401 in its basic design and functionality largely corresponds to the optical imaging arrangement 101 such that it is here mainly referred to the differences. In particular, identical components have been given the identical reference, while like components are given the same reference numeral increased by the value 300. Unless explicitly deviating statements are given in the following, explicit reference is made to be explanations given above in the context of the second embodiment with respect to these components.

The main difference between the optical imaging arrangement 401 and the optical imaging arrangement 101 lies within the deviating split design of the projection system metrology support structure 412 which is selected as a result of a slightly different arrangement of the first and second optical element subgroups 406.7 and 406.8. More precisely, mirror M3 of the first optical element subgroup 406.7 is shifted upward (in the z-direction) to be located considerably closer to mirrors M3 and M4 (than in the first embodiment as shown e.g. in FIG. 2), while mirrors M1 and M6 are shifted downward (in the z-direction) to be located considerably closer to mirror M5 (than in the first embodiment as shown e.g. in FIG. 2). Hence, a large essentially void area is created between the first and second optical element subgroups 406.7 and 406.8.

Figure 9:
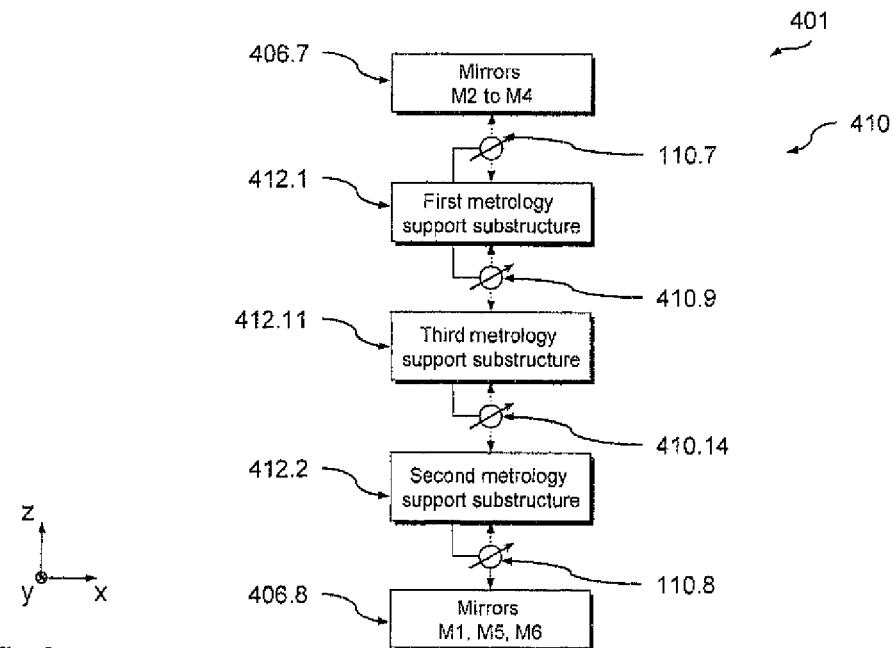
FIG. 9 is a mechanical block diagram of a part of a further preferred embodiment of an optical imaging arrangement according to the invention.

As can be seen from FIG. 9, the projection system metrology support structure 412 is split into three substructures, namely a first metrology support substructure 412.1, a second metrology support substructure 412.2, and a third metrology support substructure 412.11. The third metrology support substructure 412.11 is located between the first metrology support substructure 412.1 and the second metrology support substructure 412.2 to bridge the gap or void area between them.

Hence, as in the first embodiment, the first metrology support substructure 412.1 carries a first metrology device subgroup 410.7 associated to the first optical element subgroup 406.7 as well as a first reference metrology device 410.9 determining the relative position and orientation between the first metrology support substructure 412.1 and the third metrology support substructure 412.11 in all six degrees of freedom (in the same manner as it has been described above in the context of the first embodiment for the reference metrology unit 110.9).

Furthermore, in a manner similar to the first embodiment, the third metrology support substructure 412.11 carries a further reference metrology device 410.14 determining the relative position and orientation between the second metrology support substructure 412.2 and the third metrology support substructure 412.11 in all six degrees of freedom (in the same manner as it has been described above in the context of the first embodiment for the reference metrology unit 110.9). As an alternative, the second metrology support substructure 412.2 may carry the further reference metrology device 410.14.

Finally, also similar to the first embodiment, the second metrology support substructure 412.2 carries a second metrology device subgroup 410.10 associated to the second optical element subgroup 406.8.

Hence, the third metrology support substructure 312.11 has no metrology device subgroup associated to any optical elements but merely serves as a lightweight and highly rigid bridging unit spanning the gap or void area between the first metrology support substructure 412.1 and the second metrology support substructure 412.2.

It will be appreciated that, here as well any desired number of optical elements may be used. For example, in the present embodiment, an optical element group comprising eight optical elements may also be provided. Furthermore, it will be appreciated that, with other embodiments of the invention, any other split into any desired number of metrology support substructures may be chosen.

It will be appreciated that, with the microlithography apparatus 401 of the present embodiment, a line of sight accuracy may be obtained which is below 1 nm in all the relevant degrees of freedom, typically in the x direction and the y direction.

Although, in the foregoing, embodiments of the invention have been described where the optical elements are exclusively reflective elements, it will be appreciated that, with other embodiments of the invention, reflective, refractive or diffractive elements or any combinations thereof may be used for the optical elements of the optical element units.

Furthermore, it will be appreciated that the present invention, although mainly described in the context of microlithography in the foregoing, may also be used in the context of any other type of optical imaging process, typically requiring a comparably high level of imaging accuracy. In particular, the invention may be used in the context of any other type of optical imaging process operating at different wavelengths.

What is claimed is:

1. An arrangement, comprising:
   an optical projection system, comprising:
      a group of optical elements configured so that, during use of the optical projection system, the group of optical elements transfers an image of an object in an object plane of the optical projection system onto an image plane of the optical projection system, the group of optical elements comprising:
         a first optical element subgroup; and
         a second optical element subgroup; and
      a group of metrology devices configured so that, during use of the group of metrology devices, the group of metrology devices captures status information representative of a position and/or an orientation of each of the optical elements in at least one degree of freedom, the group of metrology devices comprising:
         a first metrology device subgroup associated with the first optical element subgroup; and
         a second metrology device subgroup associated with the second optical element subgroup;
   a support structure system, comprising:
      an optical element support structure supporting the group of optical elements;
      a metrology support structure comprising:
         a first metrology support substructure supporting the first metrology device subgroup; and
         a second metrology support substructure supporting the second metrology device subgroup; and
      a separate load bearing structure simultaneously and separately supporting: a) the optical element support structure; b) the first metrology support substructure; and c) the second metrology support substructure, wherein:
   the first metrology support substructure is supported on the load bearing structure via a first vibration isolation device, and/or the second metrology support substructure is supported on the load bearing structure via a second vibration isolation device; and
   the first vibration isolation device and/or the second vibration isolation device has a vibration isolation resonant frequency in a vibration isolation resonant frequency range selected from the group consisting of a range from 0.5 Hz to 8.0 Hz, a range from 1.0 Hz to 6.0 Hz, and a range from 2.0 Hz to 5.0 Hz.

2. The arrangement of claim 1, wherein:
   the first metrology support substructure comprises a plurality of first load bearing interface devices configured to introduce support forces into the first metrology support substructure when supporting the first metrology support substructure on the load bearing structure; and
   the first load bearing interface devices define a first load bearing interface plane located at least close to a mass center of gravity of the first metrology support substructure.

3. The arrangement of claim 1, wherein:
   the second metrology support substructure comprises a plurality of second load bearing interface devices configured to introduce support forces into the second metrology support substructure when supporting the second metrology support substructure on the load bearing structure; and
   the second load bearing interface devices define a second load bearing interface plane located at least close to a mass center of gravity of the second metrology support substructure.

4. The arrangement of claim 1, wherein the group of metrology devices comprises a metrology device configured to capture reference metrology information representative of a reference position and/or a reference orientation between the first and second metrology support substructures in at least one degree of freedom.

5. The arrangement of claim 4, wherein:
   the reference metrology device comprises a first reference metrology unit and a second reference metrology unit configured to cooperate to provide the reference metrology information;
   the first reference metrology unit is connected to the first metrology support substructure; and
   the second reference metrology unit is connected to the second metrology support sub structure.

6. The arrangement of claim 4, wherein:
   the reference metrology device comprises a first relative reference metrology unit, a second relative reference metrology unit, a third relative reference metrology unit and a fourth relative reference metrology unit configured to cooperate to provide the reference metrology information;
   the first relative reference metrology unit is connected to the first metrology support sub structure;
   the second relative reference metrology unit is connected to a reference unit;
   the first relative reference metrology unit is configured to cooperate with the second relative reference metrology unit to provide first relative reference metrology information representative of at least one of a first relative reference position and a first relative reference orientation between the first metrology support substructure and the reference unit in at least one degree of freedom;
   the third relative reference metrology unit is connected to the second metrology support sub structure;
   the fourth relative reference metrology unit is connected to the reference unit;
   the third relative reference metrology unit is configured to cooperate with the fourth relative reference metrology unit to provide second relative reference metrology information representative of at least one of a second relative reference position and a second relative reference orientation between the second metrology support substructure and the reference unit in at least one degree of freedom up to all six degrees of freedom; and
   the reference metrology device is configured to derive the reference metrology information from the first relative reference metrology information and the second relative reference metrology information.

7. The arrangement of claim 6, wherein:
   the reference unit comprises a component of the arrangement external to the metrology support structure and an optical element of the group of optical elements;
   the fourth relative reference metrology unit and the second relative reference metrology unit are located at a distance which is from 0% to 20% of a maximum dimension of the reference unit; and/or the fourth relative reference metrology unit and the second relative reference metrology unit are located at a distance of 0 mm to 80 mm.

8. The arrangement of claim 1, wherein the optical element has maximum mass among the optical elements of the group of optical elements, or the optical element is supported to exhibit maximum inertia among the optical elements of the group of optical elements.

9. The arrangement of claim 1, wherein at least one of the metrology support substructures comprises a core structure and a support arm protruding from the core structure; and the group of metrology devices comprises a metrology unit mechanically connected to a free end of the support arm.

10. The arrangement of claim 9, wherein the core structure has a maximum core structure dimension, and the support arm has a maximum arm dimension which is from 5% to 150% of the maximum core structure dimension.

11. The arrangement of claim 9, wherein the metrology unit is associated with an associated metrology unit which is connected to a component of the arrangement, and the component is selected from the group consisting of an optical element, a reference structure, and another one of the metrology support substructures.

12. The arrangement of claim 1, wherein:
the group of metrology devices comprises a third metrology device subgroup;
the metrology support structure comprises a third metrology support substructure supporting the third metrology device subgroup;
a reference metrology device and the third metrology support substructure are simultaneously and separately supported on the load bearing structure;
the reference metrology device is configured to capture reference metrology information representative of a reference position and/or a reference orientation between the third metrology support substructure and a member in at least one degree of freedom; and
the member is selected from the group consisting of the first metrology support substructure and the second metrology support substructure.

13. The arrangement of claim 1, wherein:
the metrology support structure defines a set of three orthogonal directions;
in a direction of maximum dimension selected from the three orthogonal directions, the metrology support structure has its maximum dimension among its dimensions in the three orthogonal directions; and
the metrology support structure is split to provide the first metrology support substructure and the second metrology support substructure such that the first metrology support substructure and the second metrology support substructure are mutually adjacent in the direction of maximum dimension.

14. The arrangement of claim 13, wherein, in the direction of maximum dimension, at least one of the first metrology support substructure and the second metrology support substructure has a dimension that is from 20% to 80% of its dimension in at least another one of the three orthogonal directions.

15. The arrangement of claim 13, wherein:
the metrology support structure defines a height direction, a width direction and a depth direction; and
the direction of maximum dimension is the height direction.

16. The arrangement of claim 1, wherein at least one of the metrology support substructures comprises a material selected from the group consisting of steel, aluminum, titanium, an Invar-alloy, a tungsten alloy, a ceramic material, silicon infiltrated silicon carbide, silicon carbide, silicon, carbon fiber reinforced silicon carbide, aluminum oxide, a lithium aluminosilicate glass-ceramic, a titania silicate glass, quartz, and Cordierite.

17. The arrangement of claim 1, wherein:
the arrangement further comprises a control unit configured to use the status information to control an active component of the optical imaging arrangement;
the optical projection system is a microlithography optical projection system; and/or the optical elements of the group of optical elements are reflective optical elements.

18. The arrangement of claim 1, wherein the optical projection system is an EUV microlithogrpaphy optical projection system.

19. The arrangement of claim 1, wherein the optical elements comprise reflective optical elements.

20. An optical exposure apparatus, comprising:
an arrangement according to claim 1; and
an illumination system configured to illuminate at least a portion of the object.

21. The arrangement of claim 1, wherein the load bearing structure supports the optical element support structure.

22. The arrangement of claim 1, wherein the first metrology support substructure comprises a plurality of load bearing devices contacting the first vibration isolation device.

23. The arrangement of claim 22, wherein the second metrology support substructure comprises a plurality of load bearing devices contacting the second vibration isolation device.

24. The arrangement of claim 1, wherein the resonant frequency of the first vibration isolation device is different from the resonant frequency of the second vibration isolation device.

25. The arrangement of claim 1, wherein the first vibration isolation device and/or the second vibration isolation device has a damping ratio of from 5% to 60%.

* * * * *

UNITED STATES PATENT AND TRADEMARK OFFICE
CERTIFICATE OF CORRECTION

PATENT NO. : 9,976,931 B2  
APPLICATION NO. : 14/536887  
DATED : May 22, 2018  
INVENTOR(S) : Yim-Bun Patrick Kwan and Erik Ruinemans It is certified that error appears in the above-identified patent and that said Letters Patent is hereby corrected as shown below:

In the Claims

Column 26, Claim 5, Line 9, delete "sub structure." and insert -- substructure. --.

Column 26, Claim 6, Line 9, delete "sub structure;" and insert -- substructure; --.

Column 26, Claim 6, Line 20, delete "sub structure;" and insert -- substructure; --.

Column 28, Claim 18, Line 2, delete "microlithogrpaphy" and insert -- microlithography --.

Signed and Sealed this  
Fourteenth Day of May, 2019

Andrei Iancu  
*Director of the United States Patent and Trademark Office*